United States Patent [19]
Cole

[11] Patent Number: 6,097,031
[45] Date of Patent: Aug. 1, 2000

[54] DUAL BANDWITH BOLOMETER

[75] Inventor: Barrett E. Cole, Bloomington, Minn.

[73] Assignee: Honeywell Inc., Minneapolis, Minn.

[21] Appl. No.: 08/900,251

[22] Filed: Jul. 25, 1997

[51] Int. Cl.⁷ .................................................. H01L 27/144
[52] U.S. Cl. ................................. 250/370.06; 250/338.4; 250/339.05
[58] Field of Search ......................... 250/370.06, 339.05, 250/338.4

[56] References Cited

U.S. PATENT DOCUMENTS

| 3,962,578 | 6/1976 | Roschen ................................... 250/226 |
| 4,651,001 | 3/1987 | Harada et al. ........................... 250/330 |
| 4,752,694 | 6/1988 | Hegel, Jr. et al. ....................... 250/578 |
| 4,754,139 | 6/1988 | Ennulat et al. .......................... 250/332 |
| 4,948,976 | 8/1990 | Baliga et al. ........................ 250/370.06 |
| 5,021,663 | 6/1991 | Hornbeck ................................. 250/349 |
| 5,286,976 | 2/1994 | Cole . |
| 5,293,041 | 3/1994 | Kruse, Jr. ............................. 250/338.3 |
| 5,300,915 | 4/1994 | Higashi et al. ........................ 338/22 R |
| 5,777,328 | 7/1998 | Gooch .................................. 250/338.4 |

FOREIGN PATENT DOCUMENTS

| 0481552 | 4/1992 | European Pat. Off. . |
| 0687923 | 12/1995 | European Pat. Off. . |
| 6-137943 | 5/1994 | Japan ................................. 250/338.4 |
| 9718589 | 5/1997 | WIPO . |

Primary Examiner—Constantine Hannaher
Attorney, Agent, or Firm—John G. Shudy, Jr.

[57] ABSTRACT

A dual function pixel of an array, having a large fill factor, for detecting visible light and infrared radiation through the same surface area of the pixel. Infrared radiation is absorbed by a conductive oxide layer. This absorbing layer heats up a heat detection layer which thereby indicates the impingement infrared radiation. An infrared reflecting layer made from a conductive oxide reflects infrared light passing through the absorbing layer, back to the absorbing layer. Visible light can pass through all of the layers of the pixel, which are optically transparent, to a visible light detector situated in the substrate of each pixel of the array.

34 Claims, 3 Drawing Sheets

DUAL BANDWITH BOLOMETER

BACKGROUND

The present invention pertains to detectors, and particularly to bolometers. More particularly, the invention pertains to bolometers having visible light detection capabilities.

SUMMARY OF THE INVENTION

The invention is a dual purpose visible light and infrared radiation detector in the form of an integrated circuit. It is an optically transparent infrared bolometer that achieves absorptions of ninety percent by using a thick metal oxide reflector and a thin metal oxide absorber which can pass visible light. Because of the opaqueness of the materials, prior dual bandwidth bolometers having large pixel fill factors were not possible. The invention is an approach having a bolometer array integrated on the top of a visible light detector array so that visible light can pass through the bolometer array to the other array to achieve a maximal infrared pixel fill factor and sensitivity, and still pass visible radiation to the visible detector.

DESCRIPTION OF THE EMBODIMENTS

Figure 1A:
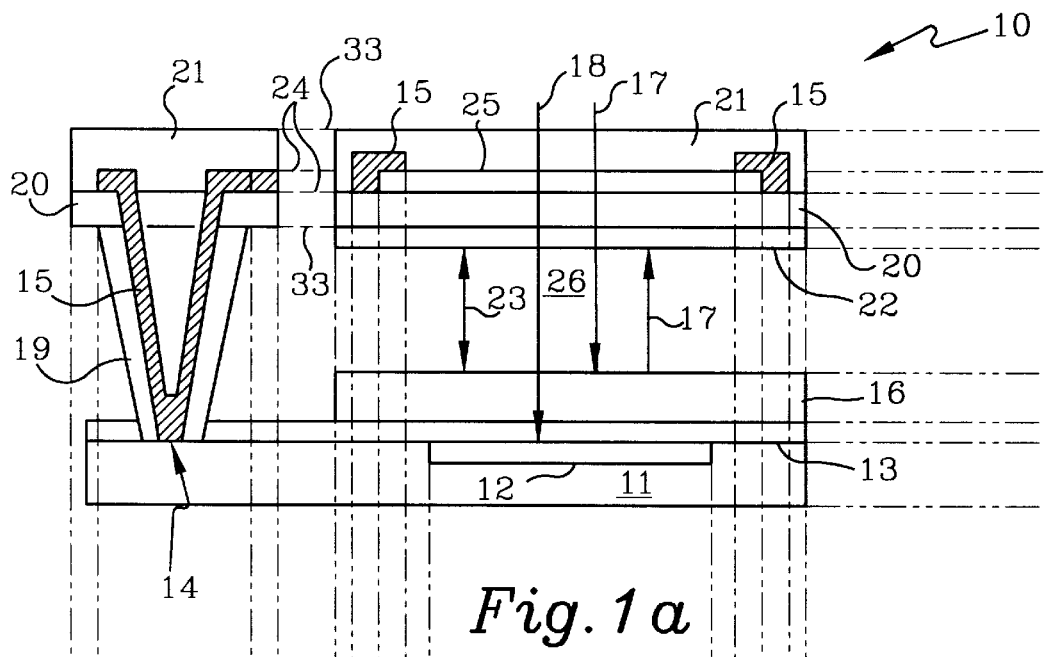
FIGS. 1a and 1b are various views of the present bolometer pixel.

FIG. 1a is a cut-a-way side view of the present bolometer pixel 10. FIG. 1a is not to scale. Formed on silicon substrate 11 is a charge coupled device (CCD) sensing pixel 12. Any other kind of visible light sensing pixel may be used so long as it is integratable into substrate 11. The IR detecting pixel 10 is positioned over visible detector 12 and contacts the substrate electronics 11 through a via 15. Over detector 12 and a portion of substrate 11 is formed a planarization layer 13. Layer 13 consists of $SiO_2$ which transmits about 96 percent of visible light that impinges it. Layer 13 has a via 14 for a contact 15. Situated on planarization layer 13 is a reflector layer 16 which has a thickness of 100–500 nanometers depending on film composition properties and desired performance. Reflector layer 16 is composed of indium tin oxide (ITO). Layer 16 provides about an eighty percent transmittance of visible light impinging on that layer 16 and reflects 80 percent of IR.

Above or adjacent to layer 16 is a cavity which functions as a low Q interference Fabry-Perot filter having a gap or distance 23 of one to two micrometers between ITO layer 16 and an ITO layer 22 which is formed on layer 20 and situated from ITO layer 16. Distance 23 indicates the gap dimension, which is tuned in fabrication to maximize IR wavelength radiation 17 that is to be enhanced and detected. The volume between layers 16 and 22 form cavity 26. ITO layer 16 is a reflector of infrared radiation 17 and transmits visible light 18.

Figure 1B:
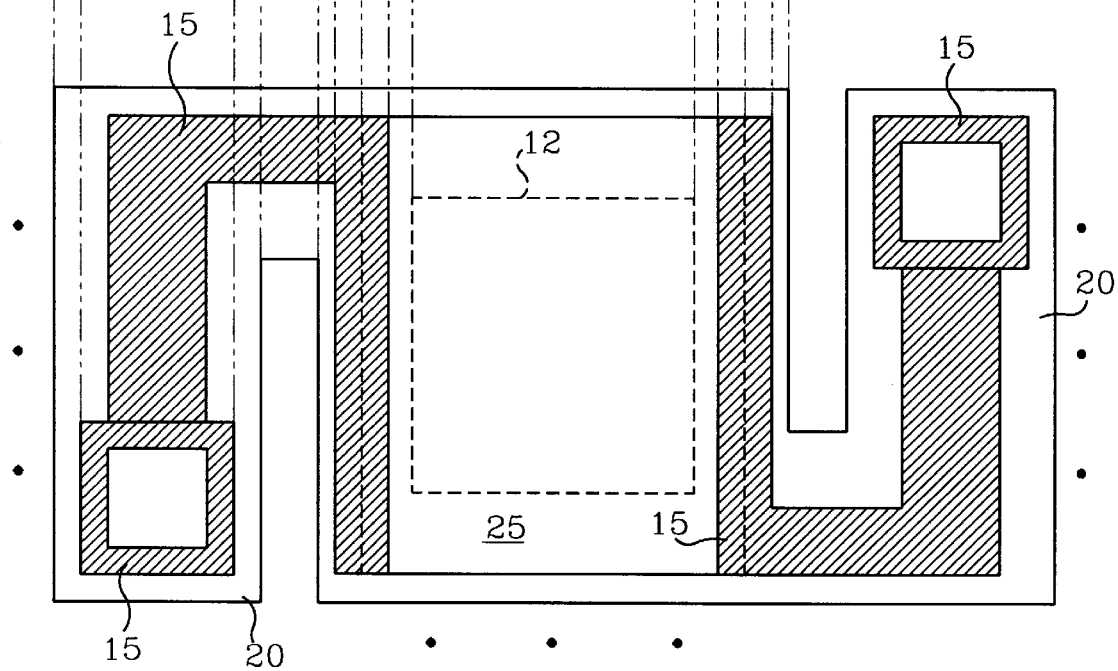

A via 14 is formed in planarization layer 13 for a contact 15 into substrate 11. Contact 15 may be connected to electronics in other layers adjacent to substrate 11. Contact 15 may be fabricated from NiCr. Formed about contact 15 is silicon nitride 19 or other like substance for passivation protection of contact 15 and the forming of a pillar to support layers 20 and 21 for cavity 26. Situated about contact 15 and on silicon nitride 19 is a layer 20 which consists of silicon nitride also. Formed on layer 20 is a layer 21 which is composed of $Si_3N_4$ or $SiO_2$. Layers 20 and 21 extend out to the light 18 and radiation 17 area. Layer 20 has a transmittance greater than 90 percent for visible light 18. Layer 21 has a transmittance greater than 90 percent for visible light 18. The continuity of these layers represented by dashed lines 33. Likewise, contact 15 extends out to areas of light 17 and 18 as indicated by dashed lines 24. FIG. 1b reveals the extension of the structure of contact 15 on layer 20. This structure is repeated and extends beyond FIG. 1b for a plurality of pixels 10 for various applications such as a scene sensing device. FIG. 1b is a planar view of the structure of pixel 10 from the light-entering direction, in the absence of layer 21.

Formed on layer 20 is a pixel layer 25 which is formed from $VO_x$ wherein x may be between 1 and 3, or other suitable high temperature coefficient of resistivity (TCR) balance for the detection material. Pixel 25 is also shown in FIG. 1b. Contact 15 is situated on a portion of layer 25 and connected to $VO_x$ layer 25. Layer 25 has a visible light transmitivity of 50 percent or greater depending on film thickness and film stoichiometry. Layer 21 is situated or formed on contact 15 and layer 25. ITO layer 22 is formed on the surface of layer 20 facing towards cavity 26. Layer 22 is about ten nanometers thick. Layer 22 should be less than 200 angstroms thick. Layer 22 has a visible light 18 transmission greater than 80 percent. Sensor layer 25 is heated upon receipt of infrared radiation 17 and has a change of resistivity which results in a change of current flow through and/or voltage drop across layer 25 thereby indicating impingement of an infrared signal on sensor pixel 10. Pixel detector layer 25 is of a $VO_x$ material having a high temperature coefficient of resistance, i.e., $$TCR = \frac{1}{R}\frac{dR}{dt},$$

such that layer 25 is a transducer that provides a signal dependent upon the temperature of detecting layer 25 heated by absorbing layer 22.

Layers 16 and 22 may instead be composed of indium tin oxide or zinc oxide or cadmium stannate. Layer 16 and 22 need not be the same material. Layer 25 may instead be composed of $VO_2$ or other high TCR semiconductor film. Substrate 11 may instead be composed of InSb or HgCdTe. Likewise, the other layers and components may be made of other materials and have different thickness and configurations. The disclosed embodiments are merely specific examples of the invention.

The arrangement of pixel 10 with infrared sensor 25 and visible light sensor 12 over each other, rather than side-by-side, results in a maximum infrared pixel 25 fill factor and collocation with a CCD pixel 12, which can also have maximal fill factor. The present pixel 12 is not possible in the related art because absorber layer 22 and reflector layer 16 are made from non-transparent materials (such as Cr, NiCr and Au) for the infrared bolometer. The use of ITO or other conductive oxides for layers 16 and 22, provides high optical transmission at 0.6–0.8 micrometer CCD wavelengths and high infrared absorption at 8 to 12 micrometer wavelengths to maximize sensitivity and performance of each pixel component for an integrated array.

Figure 2:
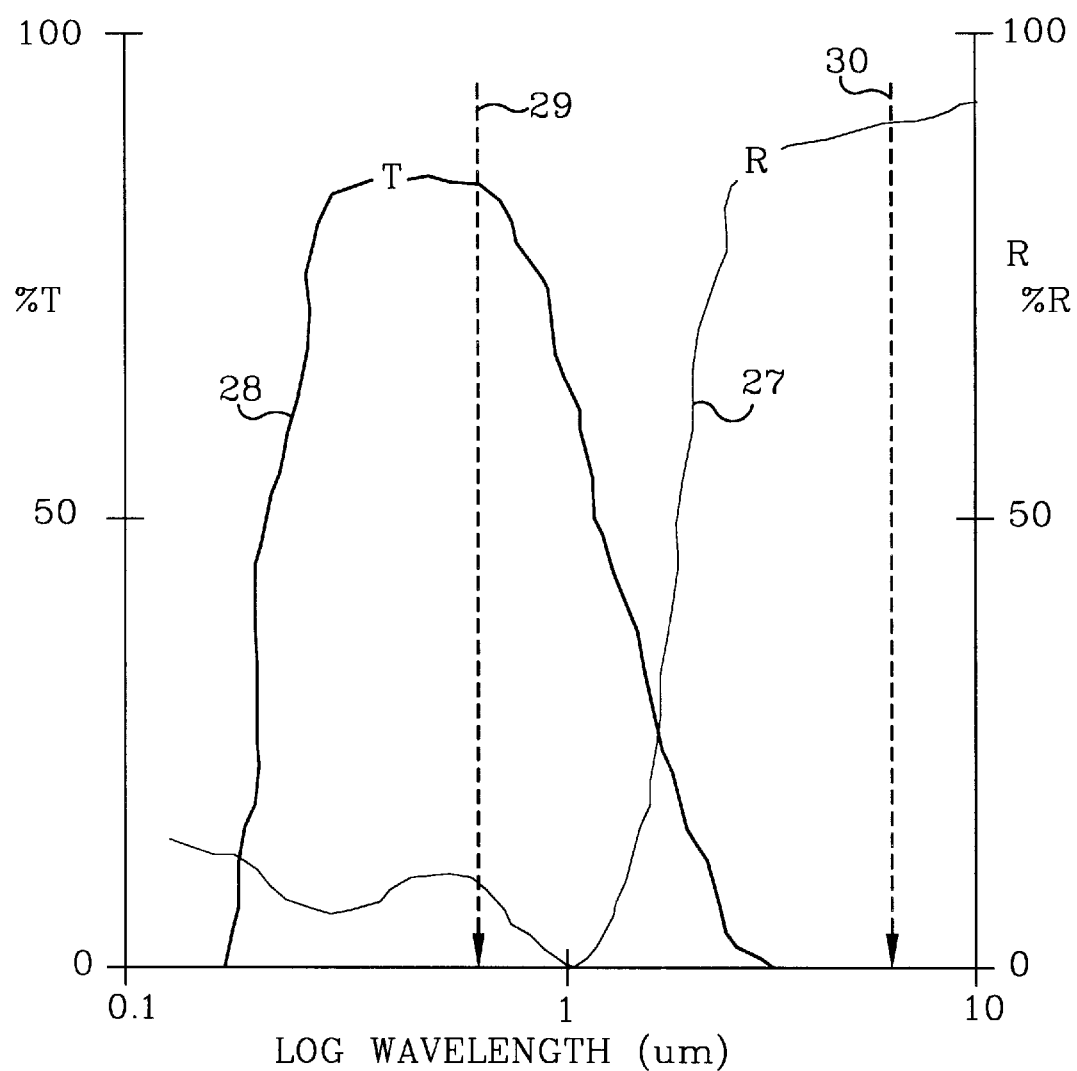
FIG. 2 is a graph of the transmissive and reflective properties of an indium tin oxide film of a typical thickness at the visible and infrared bandwidths.

Thick ITO film 16 (in the range of less than one micrometer but greater than eighty nanometers) has bulk-like properties and can be used as a cold mirror because of its ability to reflect infrared radiation 17 up to 90 percent across a wide infrared wavelength band (as shown by curve 27 in FIG. 2) and yet transmit the entire spectrum of visible light 18 (as shown by curve 28 in FIG. 2). The left abscissa shows the percentage of transmittance (% T) for curve 28. The right abscissa shows the percentage of reflection (% R) for curve 27. The ordinate is an indication of wavelength from 0.1 micrometer to 10 microns on a log scale basis, for curves 27 and 28. Line 29 shows the middle wavelength for CCD sensor 12. Line 30 shows the middle wavelength for bolometer pixel 25.

For absorption layer 22, ITO films have resistivities on the order of $10^{-6}$ to $10^{-6}$ ohm meter. To optimize pixel IR absorptance up to 90 percent, it is preferable to have an absorbing film 22 under pixel 25 that has a resistivity on the order of 300 to 600 ohms per square, depending on the optical properties of other detector films. This resistivity can be achieved by depositing a thin ITO film 22 having about a ten-nanometer thickness. Such film 22 has good optical transmission and a sheet resistance of about 600 ohms per square to provide the desired greater than 90 percent average absorptance for pixel 25.

Figure 3:
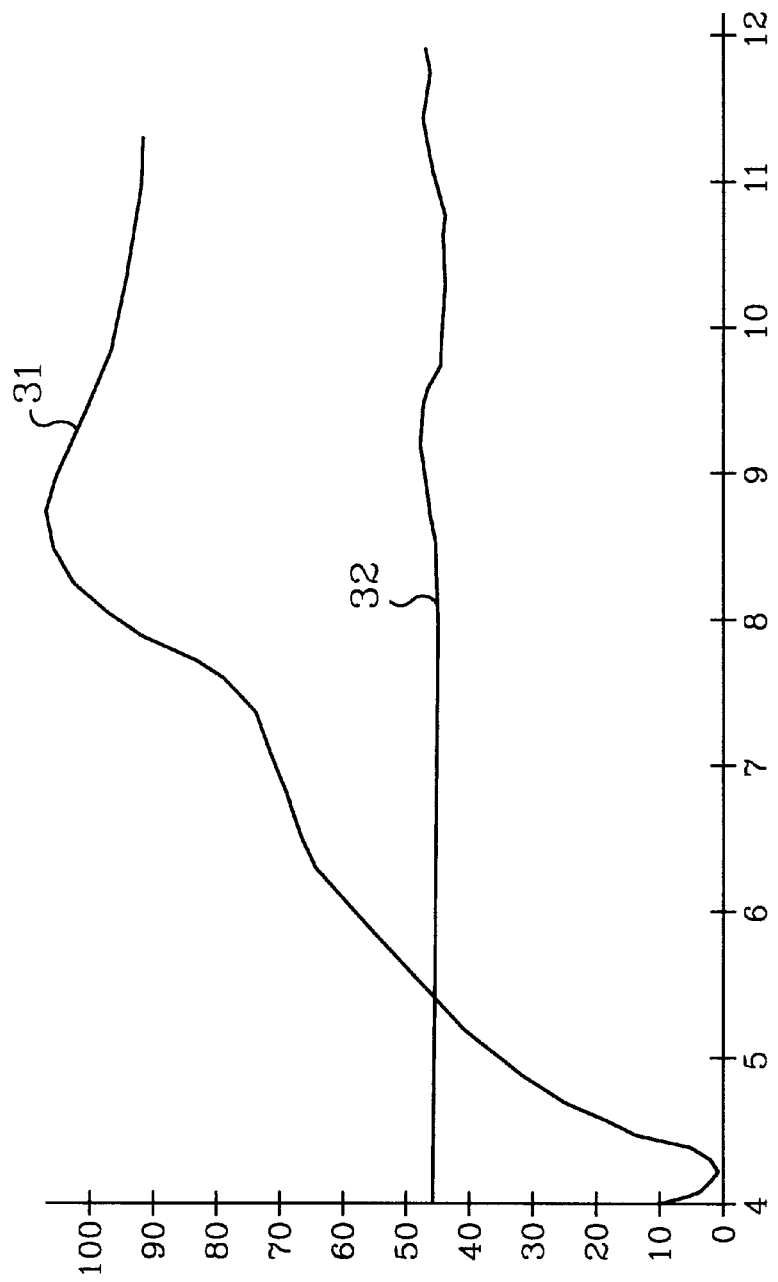
FIG. 3 shows absorptance performance for an indium tin oxide absorber with a reflector and without a reflector.

Curve 31 in FIG. 3 reveals a calculated infrared performance for the present detector 10 having an ITO layer 16 with a 90 percent reflectance for infrared light 17 and an ITO absorber layer 22 having a proper resistance of about 600 ohms per square. This detector performance is for detector 10 having a 2 micrometer gap 23 in cavity 26, a 200 nanometer $Si_3N_4$ layer 20, a 50–100 nanometer thick $VO_x$ infrared detector pixel layer 25 and a 300 nanometer $Si_3N_4$ layer 21. The absorptance of layer 22 for infrared detection layer 25 is 80 percent or more across the full long wavelength infrared 8–12 micron band, as shown by curve 31. For the same dual-bandwidth detector pixel 10 as for curve 31, but without an ITO reflector layer 16 assuming no substrate reflection and for any size of gap 23 in cavity 26, with absorber layer 22 having a proper resistance of 600 ohms/square, thin ITO absorber layer 22 transmits nearly all of visible light 18 and absorbs nearly 50 percent of infrared light 17, as shown by curve 32 of FIG. 3. The abscissa of the graph in FIG. 3 indicates the percentage of absorption by layer 22 and the ordinate axis indicates the wavelength in micrometers of the absorbed infrared light 17.

The dual bandwidth bolometer may be designed to sense two different infrared bandwidths of radiation, ultraviolet radiation, or other bandwidths of radiation, or including any combination of the various bandwidths of radiation. Further, the bolometer and/or detector may be uncooled or cooled. The present invention may include a combination of pyroelectric, thermoelectric and other types of detectors or detector layers.

What is claimed is:

1. A dual bandwidth bolometer comprising:
    a substrate;
    a visible light detector formed in said substrate;
    a detector layer, at a first distance from said substrate, and transparent to visible light, for detecting a temperature change; and
    an absorber layer, situated on a surface of said detector layer facing said substrate, and transparent to visible light, for at least partially absorbing infrared radiation.

2. The dual bandwidth bolometer of claim 1 wherein visible light passes through said detector layer, said absorber layer and onto said visible light detector.

3. The dual bandwidth bolometer of claim 2, wherein:
    infrared radiation passes through said detector layer; and
    said absorber layer has a change in temperature upon receipt of the infrared radiation and the change in temperature results in a change in temperature in said detector layer.

4. The dual bandwidth bolometer of claim 3, further comprising a reflector layer, situated on said visible light detector and said substrate, and transparent to visible light, for reflecting infrared radiation, that passes through said detector layer and said absorber layer, back to said absorber layer wherein said absorber layer has a further change in temperature upon receipt of infrared radiation reflected by said reflector layer, which in turn results in a further change in temperature in the detector layer.

5. The dual bandwidth bolometer of claim 4, further comprising:
    at least one electrically conductive contact situated on said detector layer for transmitting signals indicating a change of temperature in said detector layer; and
    a protective layer formed on said detector layer.

6. The dual bandwidth bolometer of claim 5, wherein:
    said absorber layer is composed of a conductive oxide; and
    said reflector layer is composed of a conductive oxide.

7. The dual bandwidth bolometer of claim 6, wherein:
    said absorber layer has a thickness in a range between one and twenty nanometers; and
    said reflector layer has a thickness in a range between eighty nanometers and one micrometer.

8. The dual bandwidth bolometer of claim 7, wherein said detector layer is composed of a vanadium oxide.

9. The dual bandwidth bolometer of claim 8, wherein the conductive oxide is indium tin oxide.

10. The dual bandwidth bolometer of claim 9, wherein:
    said protective layer is composed of $Si_3N_4$ or $SiO_2$; and
    said substrate contains silicon.

11. The dual bandwidth bolometer of claim 10 further comprising:
    an interface layer situated between said detector layer and said absorber layer, and transparent to visible light and infrared radiation; and
    a planarization layer, situated on said visible light detector and said substrate, having said reflector layer situated on said planarization layer, and transparent to visible light.

12. The dual bandwidth bolometer of claim 11, wherein:
    said interface layer contains silicon nitride; and
    said planarization layer contains silicon dioxide.

13. The dual bandwidth bolometer of claim 12, wherein space between said absorber and reflector layers is a cavity that forms an interference filter for infrared light.

14. The dual bandwidth bolometer of claim 13, wherein the first distance is between one and three micrometers.

15. The dual bandwidth bolometer of claim 14, wherein said protection layer and said interface layer are supported by a pillar which is situated on said substrate in a via in said planarization layer.

16. The dual bandwidth bolometer of claim 12, wherein said visible light detector is a charged coupled device.

17. The dual bandwidth bolometer of claim 16, wherein the at least one electrically conductive contact extends from said detector layer on to and through a pillar on to said substrate.

18. A dual bandwidth bolometer comprising:
    a substrate;
    a visible light detector situated on said substrate;
    a reflector layer situated on said visible light detector and said substrate, for transmitting visible light and for reflecting infrared radiation;
    an absorber layer, situated at a first distance from said reflector layer, for transmitting visible light and absorbing infrared radiation which adds heat to said absorber layer; and a detector layer, situated on said absorber layer wherein said absorber is situated between said detector layer and said reflector layer, for detecting heat from said absorber layer.

19. The bandwidth bolometer of claim 18 wherein:

said reflector layer is composed of a conductive oxide; and said absorber layer is composed of a conductive oxide.

20. A dual bandwidth bolometer having a plurality of pixels on a substrate, wherein each pixel comprises:

first detecting means, situated on said substrate, for detecting visible light;

absorbing means, situated at a first distance from said substrate, and transparent to visible light, for absorbing infrared radiation which adds heat to said absorbing means;

second detecting means, situated adjacent to said absorbing means, for detecting heat from said absorbing means.

21. The dual bandwidth bolometer of claim 20 wherein said each pixel further comprises a reflecting means, situated on said first detecting means and/or said substrate at a first distance from said absorbing means, and transparent to visible light, for reflecting infrared radiation to said absorbing means.

22. The dual bandwidth bolometer of claim 20 wherein:

said absorbing means consists of a conductive oxide; and said reflecting means consists of a conductive oxide.

23. The dual bandwidth detector of claim 22 wherein the first distance and a corresponding cavity between said absorbing and reflecting means constitutes an interference filter for enhancing absorption of infrared radiation by said absorbing means.

24. A dual bandwidth sensor comprising:

a substrate;

a first bandwidth radiation detector formed in said substrate;

a second bandwidth radiation detector layer, at a first distance from said substrate, and transparent to first bandwidth radiation, for detecting a temperature change; and an absorber layer, situated on a surface of said detector layer facing said substrate, and transparent to first bandwidth radiation, for at least partially absorbing second bandwidth radiation.

25. The dual bandwidth sensor of claim 24 wherein first bandwidth radiation passes through said second bandwidth radiation detector layer, said absorber layer and onto said first bandwidth radiation detector.

26. The dual bandwidth sensor of claim 25, wherein:

second bandwidth radiation passes through said detector layer; and said absorber layer has a change in temperature upon receipt of the second bandwidth radiation and the change in temperature results in a change in temperature in said detector layer.

27. The dual bandwidth sensor of claim 26, further comprising a reflector layer, situated on said first bandwidth radiation detector and said substrate, and transparent to first bandwidth radiation, for reflecting second bandwidth radiation that passes through said detector layer and said absorber layer back to said absorber layer wherein said absorber layer as a further change in temperature upon receipt of second bandwidth radiation reflected by said reflector layer, which in turn results in a further change in temperature in the detector layer.

28. The dual bandwidth sensor of claim 27, further comprising:

at least one electrically conductive contact situated on said detector layer for transmitting signals indicating a change of temperature in said detector layer; and a protective layer formed on said detector layer.

29. The dual bandwidth sensor of claim 28, wherein:

said absorber layer is composed of a conductive oxide; and said reflector layer is composed of a conductive oxide.

30. The dual bandwidth sensor of claim 29, wherein:

said absorber layer has a thickness in a range between one and twenty nanometers; and said reflector layer has a thickness in a range between eighty nanometers and one micrometer.

31. The dual bandwidth sensor of claim 30 further comprising:

an interface layer situated between said detector layer and said absorber layer, and transparent to first and second bandwidth radiation; and a planarization layer, situated on said first bandwidth radiation detector and said substrate, having said reflector layer situated on said planarization layer, and transparent to first bandwidth radiation.

32. The dual bandwidth sensor of claim 31, wherein space between said absorber and reflector layers is a cavity that forms an interference filter for second bandwidth radiation.

33. A method for detecting radiation of several bandwidths, comprising;

receiving first bandwidth radiation through a second bandwidth radiation detector layer and an absorber layer to a first bandwidth detector;

receiving second bandwidth radiation through the second bandwidth radiation detector layer, which is at least partially absorbed by the absorber layer which heats up the second bandwidth radiation detector layer.

34. The method for detecting radiation of claim 33, further comprising reflecting second bandwidth radiation that passes through the absorber layer back to the absorber layer.

* * * * *

Disclaimer

6,097,031—Barrett E. Cole. DUAL BANDWITH BOLOMETER. Patented August 1, 2000. Disclaimer filed August 19, 2005, by the assignee, Honeywell Inc.

Hereby enters this disclaimer to claims 20-23 of said patent.

*(Official Gazette, November 1, 2005)*

UNITED STATES PATENT AND TRADEMARK OFFICE
CERTIFICATE OF CORRECTION

PATENT NO. : 6,097,031
DATED : August 1, 2000
INVENTOR(S) : Barrett E. Cole

It is certified that error appears in the above-identified patent and that said Letters Patent is hereby corrected as shown below:

Column 4,
Line 49, delete "protection" and replace with -- protective --.

Signed and Sealed this

Twenty-eighth Day of February, 2006

JON W. DUDAS
*Director of the United States Patent and Trademark Office*